United States Patent
Weber et al.

[11] 4,242,729
[45] Dec. 30, 1980

[54] SWITCHING CONTROL OF SOLENOID CURRENT IN FUEL INJECTION SYSTEMS

[75] Inventors: Robert E. Weber, Newport News; Patrick D. Harper, Seaford, both of Va.

[73] Assignee: The Bendix Corporation, Southfield, Mich.

[21] Appl. No.: 881,324

[22] Filed: Feb. 27, 1978

[51] Int. Cl.³ .................. G05B 11/26; F02M 51/00; H03K 3/281
[52] U.S. Cl. .................. 364/431; 123/492; 323/23
[58] Field of Search ............... 364/424, 431; 323/DIG. 1, 17, 20, 23; 123/32 EH

[56] References Cited
U.S. PATENT DOCUMENTS

| | | | |
|---|---|---|---|
| 3,474,576 | 7/1973 | Gordon et al. | 123/32 EH |
| 3,721,836 | 3/1973 | Rippel | 323/DIG. 1 |
| 3,786,344 | 1/1974 | Davis et al. | 323/20 |
| 4,054,828 | 10/1977 | Conzelmann et al. | 323/DIG. 1 |

*Primary Examiner*—Felix D. Gruber
*Attorney, Agent, or Firm*—Gaylord P. Haas, Jr.; Russel C. Wells

[57] ABSTRACT

A method and apparatus for controlling the various functions of an internal combustion engine using a program-controlled microprocessor having a memory preprogrammed with various control laws and associated control schedules receives information concerning one or more engine-operating parameters such as manifold pressure, throttle position, engine coolant temperature, air temperature, engine speed or period and the like. These parameters are sensed and then supplied to input circuits for signal conditioning and conversion into digital words usable by the microprocessor. The microprocessor system computes a digital word indicative of a computer-commanded engine control operation, and output circuitry responds to predetermined computer-generated commands and to the computed digital command words for outputting corresponding pulse-width control signals for controlling such engine operations as fuel-injection, ignition timing, proportional and/or on-off EGR control, and the like.

1 Claim, 2 Drawing Figures

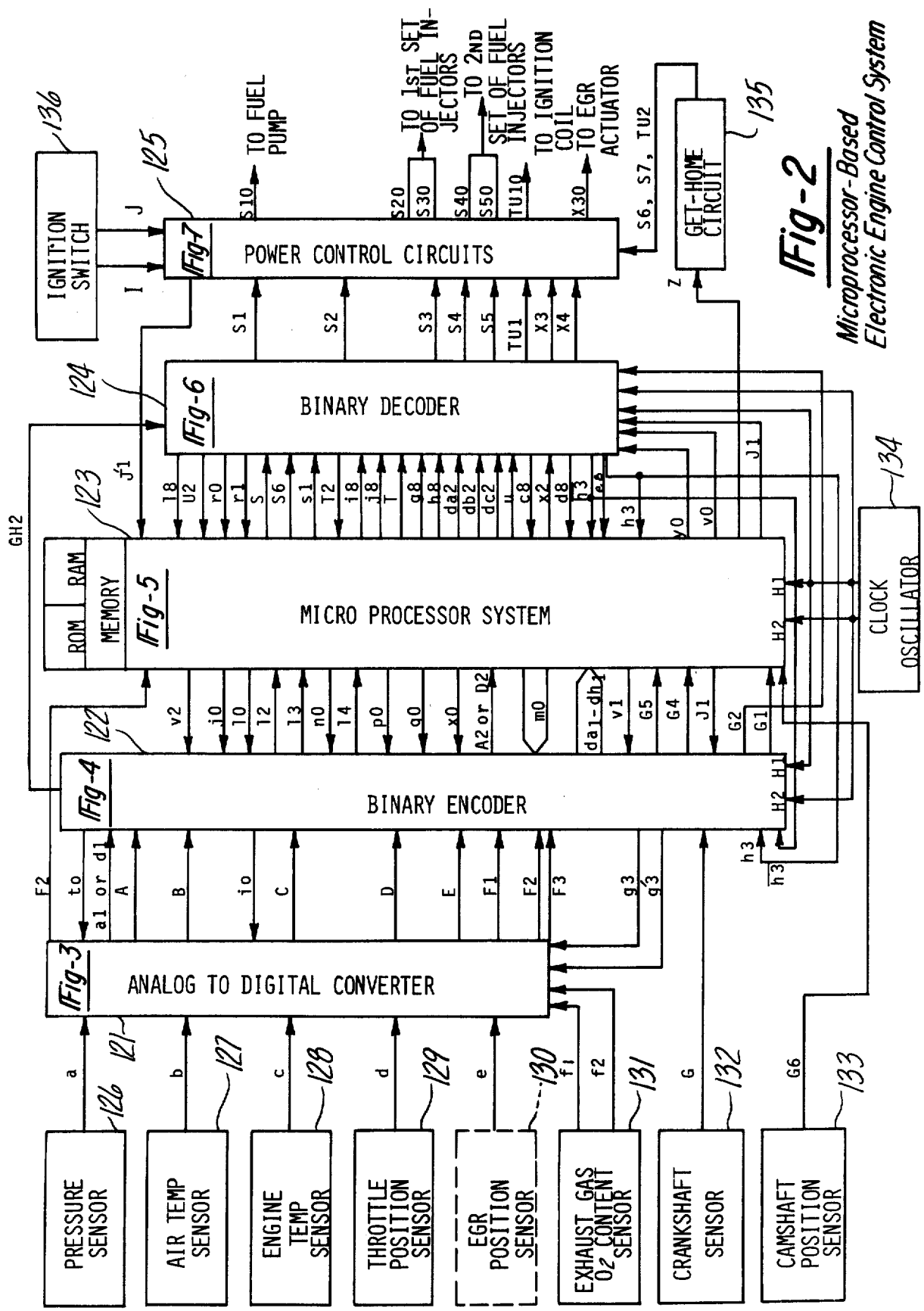

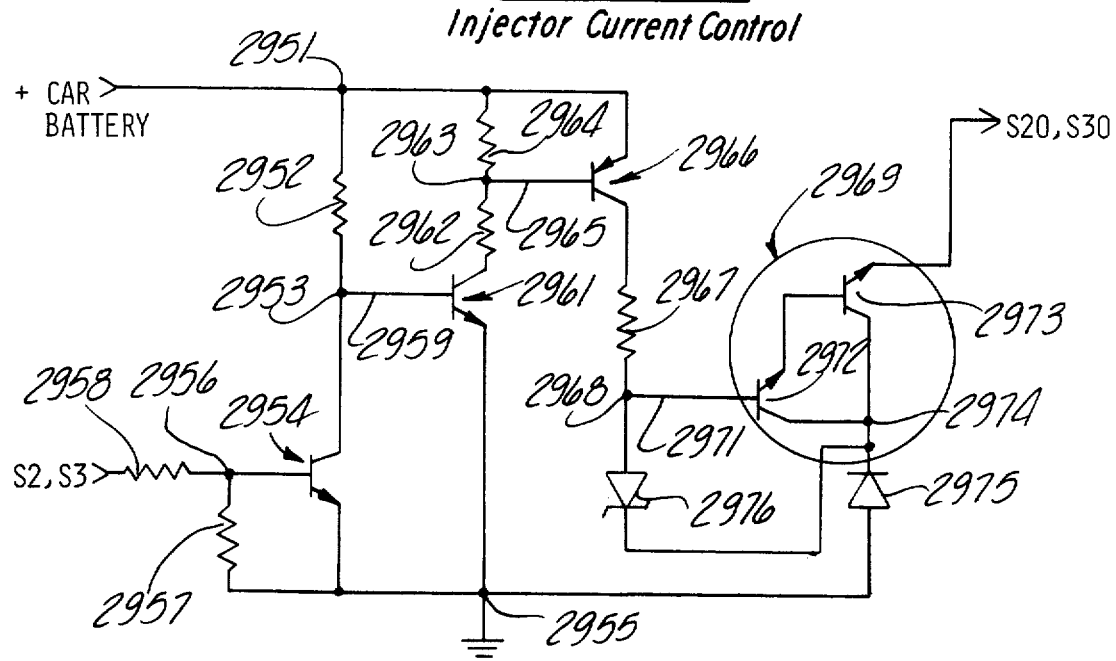
Fig-7C10
Injector Current Control

SWITCHING CONTROL OF SOLENOID CURRENT IN FUEL INJECTION SYSTEMS

BACKGROUND OF THE INVENTION

1. Field Of The Invention

This invention relates generally to a method and apparatus for controlling an internal combustion engine, and more particularly to a microprocessor-based electronic engine control system having a memory preprogrammed with various control laws and control schedules responsive to one or more sensed engine-operating parameters and generating signals for controlling fuel injection, ignition timing, EGR control, and the like.

2. Statement Of The Prior Art

Many of the patents of the prior art recognize the need for employing the enhanced accuracy of digital control systems for more accurately controlling one or more functions of an internal combustion engine.

U.S. Pat. No. 3,969,614 which issued to David F. Moyer, et al on July 13, 1976 is typical of such systems as are U.S. Pat. No. 3,835,819 which issued to Robert L. Anderson, Jr. on Sept. 17, 1974; U.S. Pat. No. 3,904,856 which issued to Louis Monptit on Sept. 9, 1975; and U.S. Pat. No. 3,906,207 which issued to Jean-Pierre Rivere, et al on Sept. 16, 1975. All of these Patents represent a break-away from the purely analog control systems of the past, but neither the accuracy, reliablity, or number of functions controlled is sufficient to meet present day requirements.

Future internal combustion engines will require that emissions be tightly controlled due to ever-increasing governmental regulations, while fuel consumption is minimized and drivability improved over the entire operating range of the engine. None of the systems of the prior art provide a method and apparatus for controlling the operation of an internal combustion engine over even a substantial portion of its operating range with sufficient accuracy to attain minimal emissions and minimual fuel consumption while simultaneously achieving improved drivability.

The systems of the prior art attempt to control one or more of the engine-operating functions, but none attempts to control the operation of the fuel pump, fuel injection, engine ignition timing, on-off and/or proportional EGR control, and the like while using feedback from such devices as oxygen sensors for emission control purposes or for effecting a closed loop fuel control mode of operation, while including provisions for optimizing acceleration enrichment handling, and the like. Moreover, the systems of the prior art are extremely expensive, difficult to repair and maintain and are, not commercially feasible at the present time.

These and other problems of the prior art are solved by the microprocessor-based electronic engine control system of the present invention which eliminates most or all of the problems of the prior arts and enables a commercially feasible implementation of a digital control system having a relatively low cost, and which is easy to repair and maintain. The system of the present invention is able to implement much more advanced and complex fuel control laws and expand the various control functions performed thereby to include ignition timing and on-off and/or proprotional EGR control while, at the same time, reducing the cost and size of the unit and increasing reliablity so as to render the system commerically feasible.

These and other objects and advantages of the present invention will be accomplished by the present method and apparatus for the electronic engine control of nearly all engine functions while simultaneously providing many safety features together with increased accuracy and ease of adaption to internal combustion engines of modern vehicles.

SUMMARY OF THE INVENTION

Means are provided for precisely controlling the current drive in a solenoid such as that used for driving electronic fuel injection injectors or the like including a circuit means for switchably controlling the solenoid current for maintaining same about a mean level and free-wheeling diode means across the inductive load for maintaining current flow during the switching operation.

INCORPORATION BY REFERENCE

This application is one of fourteen applications filed on Feb. 27, 1978, all commonly assigned and having substantially the same specification and drawings, the fourteen applications being identified below:

| Serial Number | Title |
|---|---|
| 881,321 | Microprocessor-Based Electronic Engine Control System |
| 881,322 | Feedback-Compensated Ramp-Type Analog to Digital Converter |
| 881,323 | Input/Output Electronic For Microprocessor-Based Engine Control System |
| 881,324 | Switching Control of Solenoid Current in Fuel Injection Systems |
| 881,921 | Dual Voltage Regulator With Low Voltage Shutdown |
| 881,922 | Oxygen Sensor Qualifier |
| 881,923 | Ratiometric Self-Correcting Single Ramp Analog To Pulse Width Modulator |
| 881,924 | Microprocessor-Based Engine Control Systems Acceleration Enrichment Control |
| 881,925 | Improvements in Microprocessor-Based Engine Control Systems |
| 881,981 | Oxygen Sensor Feedback Loop Digital Electronic Signal Integrator for Internal Combustion Engine Control |
| 881,982 | Improvements in Electronic Engine Controls System |
| 881,983 | Electronic Fuel Injection Compensation |
| 881,984 | Ignition Limp Home Circuit For Electronic Engine Control Systems |
| 881,985 | Oxygen Sensor Signal Conditioner |

Application Ser. No. 881,321, has been printed in its entirety, including FIGS. 1 to 10.34 and the specification of that application is specifically incorporated by reference.

BRIEF DESCRIPTION OF THE DRAWINGS

FIG. 2 is a block diagram of the microprocessor-based electronic engine control system.

FIG. 7C10 is an electronic schematic diagram of the injector control circuit.

We claim:

1. A control system for controlling the application of electrical energy from a source to a fuel injector means for an internal combustion engine including at least one solenoid-operated valve, each of said at least one solenoid-operated valve including a solenoid which is responsive to the supply of current thereto for producing relatively fast-acting valve openings and closings for precision control of the quantity of fuel injected by said solenoid-operated valve, and an electronic engine control system for generating a fuel control pulse indicative of a computed value of fuel to be injected into said engine, said control system comprising means connected between the electrical energy and the solenoid for switchably controlling the flow of current in said solenoid to minimize power consumption in response to the fuel control pulse, and a free-wheeling diode means connected in series with said switching means, said diode means and said switching means connected across the solenoid for maintaining current flow in said solenoid during the switching operation through said switching means.

* * * * *